United States Patent [19]

Ito et al.

[11] Patent Number: 4,746,549

[45] Date of Patent: May 24, 1988

[54] METHOD FOR FORMING THIN FILM OF REFRACTORY MATERIAL

[75] Inventors: Hitoshi Ito, Mitaka; Takahiko Moriya, Yokosuka, both of Japan

[73] Assignee: Kabushiki Kaisha Toshiba, Kawasaki, Japan

[21] Appl. No.: 3,550

[22] Filed: Jan. 15, 1987

Related U.S. Application Data

[63] Continuation of Ser. No. 777,516, Sep. 19, 1985, abandoned.

[30] Foreign Application Priority Data

Sep. 21, 1984 [JP] Japan ............................... 59-198072

[51] Int. Cl.[4] ............................................ C23C 16/08

[52] U.S. Cl. .................................... 427/253; 427/99; 427/124; 427/255; 427/255.1

[58] Field of Search ................. 427/255, 253, 124, 97, 427/99, 91, 237, 255.4, 255.1, 404

[56] References Cited

U.S. PATENT DOCUMENTS

| | | | |
|---|---|---|---|
| 2,885,310 | 5/1959 | Olson et al. | 427/253 |
| 3,442,690 | 5/1969 | Peake et al. | 427/253 |
| 3,477,872 | 11/1969 | Amick | 427/253 |
| 3,543,386 | 12/1970 | Inoue et al. | 427/253 |
| 3,565,676 | 2/1971 | Holzl | 427/253 |
| 3,697,343 | 10/1972 | Cuomo et al. | 427/253 |
| 4,357,365 | 11/1982 | McCarty | 427/253 |

FOREIGN PATENT DOCUMENTS

| | | | |
|---|---|---|---|
| 45-26966 | 9/1970 | Japan | 427/253 |

OTHER PUBLICATIONS

Morosanu et al., "Kinetics and Properties of Chemically Vapor-Deposited Tungsten Films on Silicon Substrates," Thin Solid Films, vol. 52, pp. 181-194, 1978.

Cuomo, "Selective-Chemical Vapor Deposition of Tungsten," Third International Conference of Chemical Vapor Deposition, pp. 270-291, 1972.

Faron et al., "High Performance Emitter for Thermionic Diode Obtained by Chemical Vapor Deposition", pp. 375-381, TS 195.157, 1973.

*Primary Examiner*—Sadie L. Childs

*Attorney, Agent, or Firm*—Finnegan, Henderson, Farabow, Garrett and Dunner

[57] ABSTRACT

In a method for forming a thin film of a refractory metal on a substrate having a silicon layer and an insulating layer on a surface thereof, a halogen compound of the refractory metal is mixed with hydrogen gas for providing a material gas, hydrogen halide gas or a halogen gas consisting of a second halogen less electronegative than the first halogen forming the halogen compound of the refractory metal is added to the material gas, and by use of the thus obtained mixed gas, vapor phase deposition refractory metal is effected selectively on the surface of the silicon layer of the substrate.

4 Claims, 3 Drawing Sheets

METHOD FOR FORMING THIN FILM OF REFRACTORY MATERIAL

This application is a continuation, of application Ser. No. 777,516, filed Sept. 19, 1985 now abandoned.

BACKGROUND OF THE INVENTION

1. Field of the Invention

This invention relates to a method for forming a thin film of a refractory metal, and more particularly to a method for forming a thin film of a refractory metal selectively on a substrate utilizing a vapor phase deposition technique.

2. Description of the Prior Art

Recently, semiconductor technologies have made great progress, and various attempts have been made to improve operational speed and integration rate of devices.

For instance, an attempt has been made in MOS integrated circuits to reduce the area of the contacting portions for electrical connection between elements and a wiring layer in order to cope with the miniaturization of elements in the integrated circuit. Further, to improve the operational speed, the depth of PN junction has been made smaller. The reduction of the contacting area and the depth of the PN junction, however, arise problems such as increasing the contact resistance and tending to break down the PN junctions during the formation of electrodes.

For instance, in a case where arsenic (As) ions are injected into a P type silicon substrate 1 shown in FIG. 3 to provide an $N^+$ silicon diffusion layer 2 forming a PN junction and having a thickness of 0.1 micron, and an aluminum electrode 5 is provided for the $N^+$ silicon layer 2 through a contact hole 4 provided through an insulating layer 3, there is a possibility of the PN junction being short-circuited by an interlayer reaction caused between silicon and aluminum respectively contained in the $N^+$ silicon layer 2 and the aluminum electrode 5.

As a technique for preventing the interlayer reaction, a method has attracted attention in which a barrier metal between the aluminum electrode 5 and the $N^+$ silicon layer 2 is interposed. According to this method, as a material for the barrier metal, titanium, tungsten, and the like are usually employed and the barrier metal is formed, for example, by depositing selectively on the $N^+$ diffused layer 2 by use of a vapor phase growing method, the barrier metal may also be formed by depositing titanium silicide using the spattering method and then removing the deposition except the contacting portion by photo-lithoetching method.

In an actual fabrication, the $N^+$ silicon layer 2 is formed in the P type silicon substrate 1 as shown in FIG. 4(*a*) by injecting arsenic (As) ions into the substrate 1 using silicon oxide film as a mask. A silicon oxide layer 3 is then formed on the entire surface of the substrate 1 and then $N^+$ silicon layer 2. By the photoetching method, a hole 6 of approximately 1.0 $\mu^2$ is formed through the silicon oxide layer 3, and by a vapor phase deposition method, a thin layer 7 of, tungsten is selectively formed only at a portion defined by the hole 6 through which the surface of silicon is exposed outside as shown in FIG. 4(*b*), and then the aluminum electrode 5 is deposited on the tungsten thin layer 7 as shown in FIG. 4(*c*). In this manner, diffusion of silicon from the substrate into the aluminum electrode 5 during heat treatment can be prevented by the provision of the tungsten thin layer 7.

At this time, it is known that if the tungsten layer 7 is thick enough to bury the hold 6 completely and the aluminum electrode 5 is deposited after the surface of the tungsten layer 7 has been smoothed, the thickness of the aluminum electrode can be made even and an electrically reliable terminal connection can be thereby realized. However, it has not been easy heretofore to provide a diffused layer of such a large thickness by the selective vapor phase deposition method without losing the selectivity.

As for the formation of tungsten thin film using $WF_6$ and $H_2$, there are reports by Jerome J. Cuomo, "Selective Chemical Vapor Deposition of Tungsen", the third International Conference of Chemical Vapor Deposition, 1972, pp. 270–291, and by Constantin-Eugen Morosamu and Valerian Soltuz, "Kinetics and Properties of Chemically Vapor Deposited Tungsten Films on Silicon", Thin Solid Films, Vol. 52, pp. 181–194, 1978. However, the above described problem still remains unsolved despite of these reports. This problem commonly arises in the selective vapor phase deposition applied not only to the formation of tungsten film but also to the formation of any other refractory metals, and therefore thick layer of these metals has not yet been produced without losing the selectivity.

SUMMARY OF THE INVENTION

An object of the present invention is to provide a method for forming a thin film of a refractory metal with a comparatively large thickness while maintaining the selectivity.

According to the present invention, there is provided a method for forming a thin film of a refractory metal on a substrate comprising the step of depositing selectively a refractory metal layer on the substrate according to the selective vapor phase deposition by using a mixed gas as a material gas, the mixed gas comprising a halogen compound of a refractory metal, a hydrogen gas, and one of a halide gas and halogen gas each including a second halogen less electronegative than a first halogen constituting the halogen compound of the refractory metal.

When the method of the invention is applied to a substrate having a silicon layer and an insulating layer on a surface of the substrate, silicon halide, which is a principal reaction product at the time the refractory metal is deposited on the surface of the silicon layer under existence of a halogen gas or a hydrogen halide gas, tends to react with the halogen gas or the hydrogen halide gas so as to be formed into a compound which is volatile and not easily stick to the surface of the insulating layer, and therefore a thick layer of the refractory metal can be deposited on the surface of the silicon layer while maintaining the selectivity.

BRIEF DESCRIPTION OF THE DRAWINGS

In the accompanying drawings FIG. 1(*a*) is a cross-sectional diagram showing one part of a MOS integrated circuit which is formed according to a preferred embodiment of the present invention.

DESCRIPTION OF THE PREFERRED EMBODIMENT

The invention will now be described in detail with reference to FIGS. 1(*a*), 1(*b*), 1(*c*) and 2.

Figure 1A:
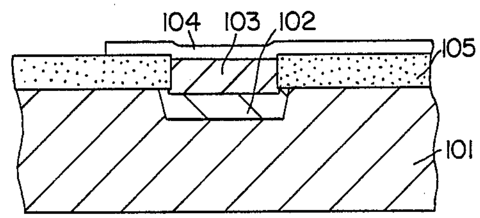
FIGS. 1(*b*) and 1(*c*) are diagrams showing production steps of the MOS integrated circuit.
Figure 1B:
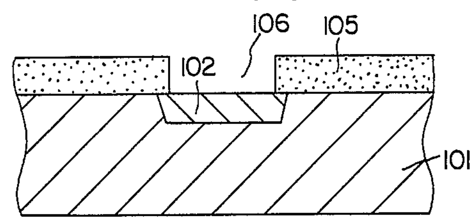
Figure 1C:
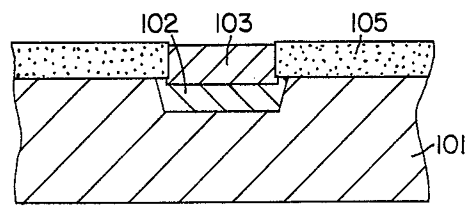

FIG. 1(*a*) illustrates a MOS integrated circuit produced by a method constituting a preferred embodiment of the present invention, in which an N+ silicon layer 102 is formed in a P type silicon substrate 101 by laying arsenic ions into the substrate 101 by means of ion implantation method. On the N+ silicon layer 102, a comparatively thick tungsten layer 103 is formed, and an aluminum electrode layer 104 is formed to cover the tungsten layer 103. The thickness of the tungsten layer 103 is selected substantially equal to the thickness of an insulating silicon oxide layer 105 which is formed to cover the entire surface of the substrate 101 except contact area to the N+ diffusion layer 102. The outer surface of the tungsten layer 103 is made to be flat, and the aluminum electrode layer 104 is formed to cover the flat outer surface of the tungsten layer 103.

The tungsten layer 103 is formed by applying a selective vapor phase deposition method to the P type silicon substrate 101 after the formation of the N+ silicon layer 102 and the silicon oxide insulting layer 105 having a hole 106 on the substrate 101 as shown in FIG. 1(*b*).

Figure 2:
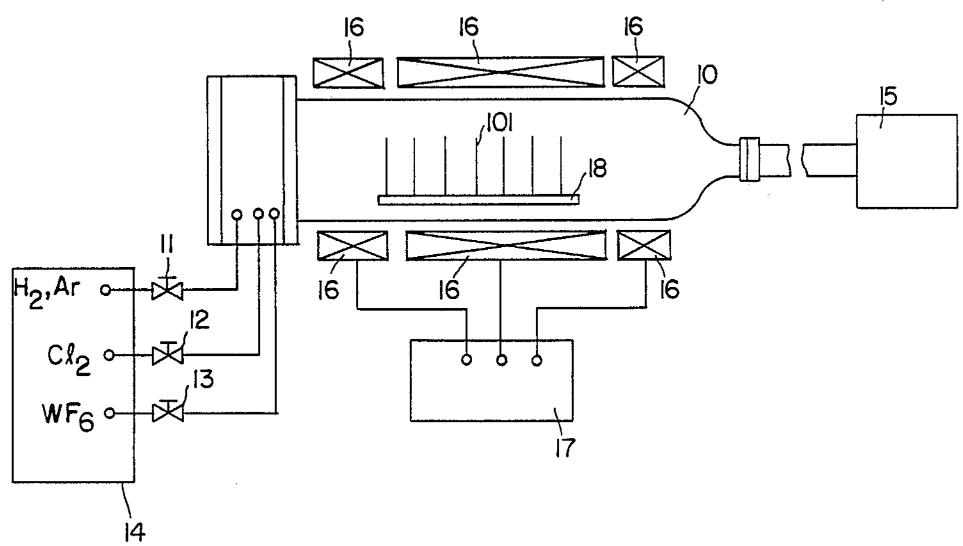
FIG. 2 is a diagram showing a vapor phase deposition device.
Figure 3:
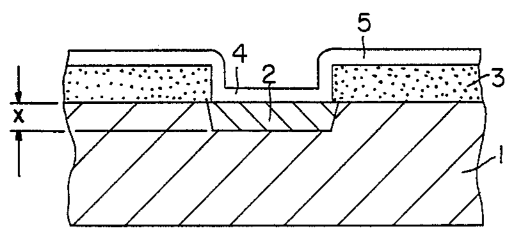
FIG. 3 is a cross-sectional diagram showing one part of a conventional MOS integrated circuit.
Figure 4A:
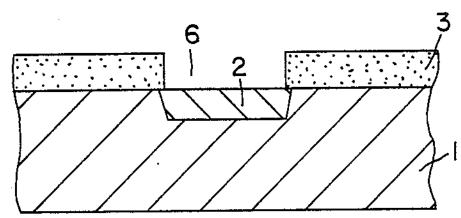
FIGS. 4(*a*), 4(*b*) and 4(*c*) are diagrams showing production steps of a modification of the conventional MOS integrated circuit shown in FIG. 3.
Figure 4B:
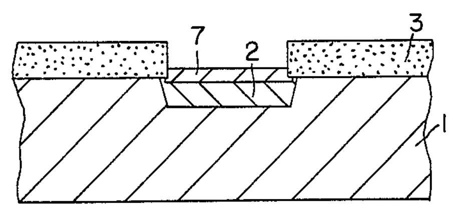
Figure 4C:
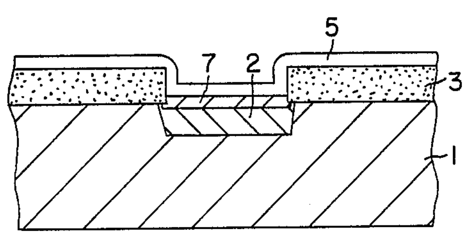

Usually, the tungsten layer 103 is formed within a vapor phase deposition device as shown in FIG. 2 which comprises a reaction furnace 10, a gas control device 14 which includes first, second and third cocks 11, 12 and 13 for controlling the introduction of hydrogen gas and argon gas, chlorine ($Cl_2$) gas, and tungsten hexafluoride ($WF_6$) gas into the furnace 10 for regulating partial pressures of these gases, a device 15 for exhausting gases from the furnace 10, and a temperature control device 17 which transfer resistance type heaters for controlling the temperature in the furnace 10.

A method for selectively forming a thick tungsten layer 103 on the surface of a silicon layer (in this case, N+ silicon layer 102) which is provided on the surface of the silicon substrate 101 together with a silicon oxide layer 105 in a mixed manner as shown in FIG. 1(*b*) will now be described.

Firstly, a silicon substrate 101 as a sample placed on a boat 18 is inserted into the reaction furnace 10.

After exhausting gases in the furnace 10 by the exhaust device 15, the first cock 11 is operated to supply argon gas which is operable as a carrier gas. When the partial pressure of the argon gas becomes to a value within the range of 0.05 to 0.1 Torr, the resistance type heaters 16 are operated so that the temperature of the substrate is monitored to be a constant value within 300°-700° C. Then the first cock 11 is transferred to a position to stop the supply of argon, then starting supply of hydrogen gas until the partial pressure thereof becomes to 0.01-20 Torr. Then the second cock 12 is opened to supply chlorine gas into the furnace 10 until the partial pressure becomes 0.001-10 Torr. Lastly, the third cock 13 is opened to supply tungsten hexafluoride gas for a predetermined time until the partial pressure becomes to 0.01-0.1 Torr, so that a thick tungsten layer is formed in the hole 106 on the substrate 101 as shown in FIG. 1(*a*). The deposition rate of tungsten at this time is in a range of 10-500 A/min, and the tungsten is deposited selectively only on the surface of the N+ silicon layer instead of the silicon oxide layer. It is considered that the selective deposition by adding chlorine gas is achieved by the following reasons.

Firstly the tungsten hexafluoride reacts with silicon of the N+ silicon substrate thereby producing silicon fluorides ($SiF_x$, x=1-4) while depositing the tungsten layer. The chlorine gas added reacts with the silicon fluorides to produce $SiF_3Cl$, $SiF_2Cl_2$, $SiFCl_3$, and $SiCl_4$. Since these compounds are volatile and less reactive with the silicon oxide layer than the silicon fluoride $SiF_x$, addition of chlorine gas prevents reaction of $SiF_x$ with the silicon oxide layer and removes $SiF_x$ from the surface of the silicon oxide layer.

Since the tungsten layer is selectively deposited on the surface of the N+ silicon layer. It is possible to deposit tungsten layer, until the thickness of the tungsten layer is substantially made equal to that of the silicon oxide layer 105, the aluminum electrode 103 can be formed by a vapor deposition method on the flat surface of the tungsten layer as shown in FIG. 1(*a*), so that a MOS integrated circuit of high reliability can be thereby provided.

Although tungsten hexafluoride gas has been used in the above described embodiment for producing a deposited refractory metal layer, it is apparent that various metal halides such as tungsten hexachloride ($WCl_6$), molybdenum pentachloride ($MoCl_5$) etc. may be used in the present invention. In such case, halogen gas or hydrogen halide gas added thereto is made of a halogen less electronegative than that used for providing the refractory metal halide. That is, when the utilized metal halide gas is tungsten hexafluoride as in the case the above described embodiment, the deposition of the refractory metal such as tungsten or else on the silicon oxide layer can be suppressed by adding either one of chlorine ($Cl_2$), bromine ($Br_2$), iodine ($I_2$), hydrogen chloride (HCl), hydrogen bromide (HBr), and hydrogen iodide (HI) gases made of a halogen which is less electronegative than fluorine, and rather thick refractory metal layer can be formed on the surface of N+ silicon layer selectively.

What is claimed is:

1. A method for selectively forming a thin film of a refractory metal on a silicon surface partially covered with an insulating layer having an opening, comprising the steps of:

(a) depositing selectively a refractory metal layer on said silicon surface according to selective vapor phase deposition by using a mixed gas comprising:
   (i) a halogen compound of a refractory metal,
   (ii) a hydrogen gas, and
   (iii) one of a halide gas and a halogen gas, the halogen element constituting the halide gas (a)(iii) or the halogen gas (a)(iii) being less electro-negative than the halogen constituting said halogen compound (a)(i) of said refractory metal, and (b) selectively forming said thin film in said opening by a chemical reaction of the silicon surface with said halogen compound of said refractory metal.

2. A method according to claim 1 wherein said halogen compound of said refractory metal is tungsten hexafluoride, and said halogen gas or halide gas is either one of chlorine ($Cl_2$), bromine ($Br_2$), iodine ($I_2$), hydrogen chloride (HCl), hydrogen bromide (HBr) and hydrogen iodide (HI).

3. A method according to claim 1 wherein said halogen compound of said refractory metal is tungsten hexachloride ($WCl_6$) and said halogen gas or halide gas is either one of bromine ($Br_2$), iodine ($I_2$), hydrogen bromide (HBr) and hydrogen iodide (HI).

4. A method according to claim 1 wherein said halogen compound of said refractory metal is molybdenum pentachloride ($MoCl_5$), and said halogen gas or halide gas is either one of bromine ($Br_2$), iodine ($I_2$), hydrogen bromide (HBr) and hydrogen iodide (HI).

* * * * *